(12) United States Patent  
Chang et al.

(10) Patent No.: US 11,594,065 B2  
(45) Date of Patent: Feb. 28, 2023

(54) OPTICAL IMAGE RECOGNITION DEVICE AND METHOD FOR FABRICATING THE SAME

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Chun Te Chang, Shenzhen (CN); Chung Wu Liu, Shenzhen (CN); Ming Chiang Yu, Shenzhen (CN); Chia Yuan Wu, Shenzhen (CN)

(73) Assignees: Interface Technology (Chengdu) Co., Ltd., Chengdu (CN); Interface Optoelectronics (Shenzhen) Co., Ltd., Shenzhen (CN); General Interface Solution Limited, Miaoli Country (TW)

( * ) Notice: Subject to any disclaimer, the term of this patent is extended or adjusted under 35 U.S.C. 154(b) by 0 days.

(21) Appl. No.: 17/689,272

(22) Filed: Mar. 8, 2022

(65) Prior Publication Data  
US 2022/0198821 A1 Jun. 23, 2022

Related U.S. Application Data

(62) Division of application No. 16/790,906, filed on Feb. 14, 2020, now Pat. No. 11,308,728.

(30) Foreign Application Priority Data

Oct. 23, 2019 (CN) .......................... 201911012038.X

(51) Int. Cl.  
*G06V 40/13* (2022.01)  
*H05K 13/04* (2006.01)  
*G02B 27/30* (2006.01)

(52) U.S. Cl.  
CPC ..... *G06V 40/1318* (2022.01); *H05K 13/0469* (2013.01); *G02B 27/30* (2013.01); *H05K 2201/05* (2013.01)

(58) Field of Classification Search  
CPC .......... G06V 40/1318; H05K 13/0469; H05K 2201/05; G02B 27/30  
See application file for complete search history.

(56) References Cited

U.S. PATENT DOCUMENTS

2017/0243705 A1* 8/2017 Bae ........................ H05K 1/028  
2018/0060632 A1* 3/2018 Knabenshue ......... G06F 1/1607  
(Continued)

*Primary Examiner* — Stephen G Sherman  
(74) *Attorney, Agent, or Firm* — Rosenberg, Klein & Lee

(57) ABSTRACT

An optical image recognition device and a method for fabricating the same are disclosed. The device includes a flexible printed circuit board, an image sensor, a glue, an optical collimator, a supporting ring, a sealant, and an optical filter. The top of the flexible printed circuit board is provided with a recess, the image sensor is located in the recess, the sidewalls of the image sensor and the recess are separated from each other, and the image sensor is coupled to the flexible printed circuit board through conductive wires. The glue adheres to the flexible printed circuit board and the image sensor and covers the conductive wires. The optical collimator is disposed on the image sensor. The supporting ring, disposed on the flexible printed circuit board, surrounds the glue and the optical collimator. The optical filter, disposed on the sealant, shields the optical collimator and the image sensor.

5 Claims, 23 Drawing Sheets

(56) References Cited

U.S. PATENT DOCUMENTS

| | | | | |
|---|---|---|---|---|
| 2018/0293420 A1* | 10/2018 | Kim | ................. | G06F 3/0421 |
| 2018/0357462 A1* | 12/2018 | Mackey | .............. | G02F 1/13338 |
| 2019/0095684 A1* | 3/2019 | Yu | ...................... | G06F 1/1626 |

* cited by examiner

OPTICAL IMAGE RECOGNITION DEVICE AND METHOD FOR FABRICATING THE SAME

CROSS REFERENCE TO RELATED APPLICATIONS

This application is a Divisional Application of co-pending application Ser. No. 16/790,906, filed on Feb. 14, 2020, for which priority is claimed under 35 U.S.C. § 120; and this application claims priority of Application No. 201911012038.X filed in China on Oct. 23, 2019 under 35 U.S.C. § 119, the entire contents of all of which are hereby incorporated by reference.

BACKGROUND OF THE INVENTION

Field of the Invention

The present invention relates to the image recognition technology, particularly to an optical image recognition device and a method for fabricating the same.

Description of the Related Art

Typically, fingerprints have a number of features including ridges, valleys, and finer points. A finer point includes a bifurcation where a ridge is branched and an end point where the ridge ends. The fingerprint can be regarded as a unique biometric data since its characteristic distribution is different every person and two people cannot have the same fingerprints. Thus, the use of biometric data such as fingerprints in a security system may ensure efficient and accurate protection for the district that requires security, movable assets or the like. A fingerprint recognition apparatus for acquiring an image of the fingerprint may be classified into a capacitive type apparatus and optical type apparatus. For the full-screen panel, the area under the screen that originally used for recognizing fingerprints has also been pressed. For the sake of aesthetics and market considerations of peripheral accessories, smartphone manufacturers do not intend to place fingerprints on the back of the screen. Therefore, optical fingerprint recognition devices are the future. In the conventional technology, if an optical fingerprint recognition device is to be manufactured, a complementary metal-oxide-semiconductor (CMOS) sensor is formed on a substrate, an optical collimator is formed on the sensor, and finally an infrared cut-off (IR-Cut) optical filter is formed above the optical collimator to shield the light route. However, the thinnest total thickness of the optical fingerprint recognition device can reach 475 µm, which does not meet the requirement for customers' mobile phones each having a thickness smaller than 400 µm.

To overcome the abovementioned problems, the present invention provides an optical image recognition device and a method for fabricating the same.

SUMMARY OF THE INVENTION

The primary objective of the present invention is to provide an optical image recognition device and a method for fabricating the same, which form a recess on a flexible printed circuit board, form an image sensor in the recess, and alternatively use a thermal release film to remove a substrate, thereby reducing the total thickness of the recognition device.

To achieve the abovementioned objectives, the present invention provides an optical image recognition device, which comprises: a flexible printed circuit board with a top thereof provided with a recess; an image sensor formed in the recess, an annular gap formed between sidewalls of the image sensor and the recess, and the image sensor coupled to the flexible printed circuit board through a plurality of conductive wires; a glue, filling the annular gap, formed on the image sensor and the flexible printed circuit board, and the glue adhering to the image sensor and the flexible printed circuit board and encapsulating the plurality of conductive wires; an optical collimator formed on the image sensor; a supporting ring, formed on the flexible printed circuit board, surrounding the glue and the optical collimator, and a height of a top of the supporting ring is higher than heights of tops of the plurality of conductive wires and a height of a top of the optical collimator; a sealant formed on the supporting ring; and an optical filter, formed on the sealant, shielding the optical collimator and the image sensor.

In an embodiment of the present invention, the glue comprises: a sealing glue filling the annular gap and adhering to the image sensor and the flexible printed circuit board; and an insulation glue, formed on the image sensor, the flexible printed circuit board, and the sealing glue, encapsulating the plurality of conductive wires, and the supporting ring surrounding the insulation glue.

In an embodiment of the present invention, the optical image recognition device further comprises a packaging glue formed on the flexible printed circuit board, the supporting ring, and the optical filter, and the packaging glue covers sidewalls of the supporting ring and the optical filter.

In an embodiment of the present invention, the recess penetrates through the flexible printed circuit board, and a height of a bottom of the image sensor is equal to a height of a bottom of the flexible printed circuit board.

In an embodiment of the present invention, the optical image recognition device further comprises a stainless steel ring formed on the supporting ring, a height of a top of the stainless steel ring is equal to a height of a top of the sealant, and the optical filter is formed on the stainless steel ring.

In an embodiment of the present invention, the image sensor is a complementary metal-oxide-semiconductor (CMOS) image sensor, the optical filter is an infrared cut-off (IR-Cut) filter, and the optical collimator is a microelectromechanical systems (MEMS) structure.

In an embodiment of the present invention, the supporting ring comprises polyimide (PI).

In an embodiment of the present invention, the flexible printed circuit board, the supporting ring, the sealant, and the optical filter have a total thickness less than 335 µm, and the total thickness is larger than or equal to 325 µm.

In an embodiment of the present invention, the optical image recognition device further comprises a stainless steel ring formed on the supporting ring, a height of a top of the stainless steel ring is higher than a height of a top of the sealant, and the stainless steel ring surrounds the optical filter.

The present invention also provides a method for fabricating an optical image recognition device, which comprises: providing a substrate provided with a thermal release film thereon; forming a flexible printed circuit board on the thermal release film, and a top of the flexible printed circuit board is provided with a recess; forming an image sensor in the recess, an annular gap formed between sidewalls of the image sensor and the recess, forming an optical collimator on the image sensor, and forming a sealing glue in the annular gap to adhere to the flexible printed circuit board and the image sensor; forming a plurality of conductive wires on the image sensor and the flexible printed circuit board to electrically connect to the image sensor and the flexible printed circuit board; forming an insulation glue on the image sensor, the flexible printed circuit board, and the sealing glue to encapsulate the plurality of conductive wires; forming a supporting ring on the flexible printed circuit board to surround the insulation glue and the optical collimator, and a height of a top of the supporting ring is higher than heights of tops of the plurality of conductive wires and a height of a top of the optical collimator; forming a sealant on the supporting ring; forming an optical filter on the sealant to shield the optical collimator and the image sensor; and removing the substrate and the thermal release film from the flexible printed circuit board.

In an embodiment of the present invention, after the step of forming the optical filter on the sealant and before the step of removing the substrate and the thermal release film from the flexible printed circuit board, a packaging glue is formed on the flexible printed circuit board, the supporting ring, and the optical filter to cover sidewalls of the supporting ring and the thermal release film.

In an embodiment of the present invention, in the step of forming the image sensor in the recess, forming the optical collimator on the image sensor, and forming the sealing glue in the annular gap, the sealing glue is formed in the annular gap after forming the image sensor in the recess and forming the optical collimator on the image sensor.

In an embodiment of the present invention, the recess penetrates through the flexible printed circuit board and a height of a bottom of the image sensor is equal to a height of a bottom of the flexible printed circuit board.

In an embodiment of the present invention, in the step of forming the sealant on the supporting ring, the sealant and a stainless steel ring are formed on the supporting ring, and a height of a top of the stainless steel ring is equal to a height of a top of the sealant; and in the step of forming the optical filter on the sealant, the optical filter is formed on the sealant and the stainless steel ring.

The present invention also provides a method for fabricating an optical image recognition device, which comprises: providing a flexible printed circuit board, a top of the flexible printed circuit board is provided with a recess and a supporting ring, the supporting ring is provided with a stainless steel ring thereon, the supporting ring separates from a sidewall of the recess, and the stainless steel ring separates from an inner sidewall of the supporting ring; forming an image sensor in the recess, an annular gap formed between a sidewall of the image sensor and the sidewall of the recess, and forming an optical collimator on the image sensor; forming a plurality of conductive wires on the image sensor and the flexible printed circuit board to electrically connect to the image sensor and the flexible printed circuit board; forming a glue in the annular gap and on the image sensor and the flexible printed circuit board to adhere to the image sensor and the flexible printed circuit board and encapsulate the plurality of conductive wires; forming a sealant on the supporting ring, and the stainless steel ring surrounds the sealant; and forming an optical filter on the sealant to shield the optical collimator and the image sensor, and the stainless steel ring surrounds the optical filter.

In an embodiment of the present invention, a height of a top of the stainless steel ring is higher than a height of a top of the sealant.

Below, the embodiments are described in detail in cooperation with the drawings to make easily understood the technical contents, characteristics and accomplishments of the present invention.

DETAILED DESCRIPTION OF THE INVENTION

Figure 1:
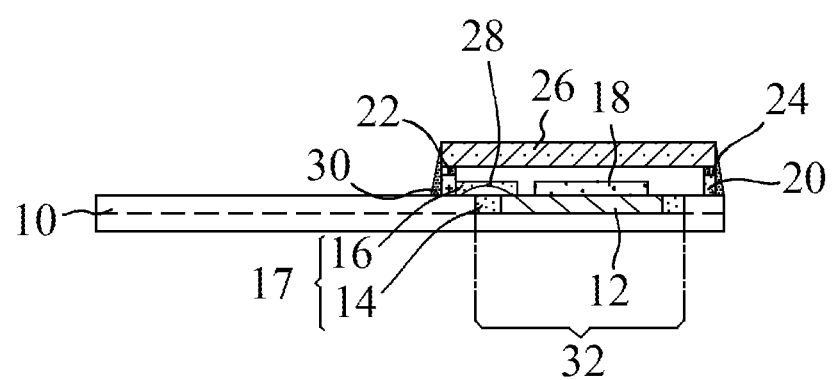
FIG. 1 is a sectional view of an optical image recognition device according to the first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means. The term "and/or" may comprise any and all combinations of one or more of the associated listed items. In addition, the singular forms "a," "an," and "the" herein are intended to comprise the plural forms as well, unless the context clearly indicates otherwise.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Refer to FIG. 1. The first embodiment of the optical image recognition device is introduced as follows. The optical image recognition device comprises a flexible printed circuit board 10, an image sensor 12, a glue 17 including a sealing glue 14 and an insulation glue 16, an optical collimator 18, a supporting ring 20, a sealant 22, a stainless steel ring 24, an optical filter 26, a plurality of conductive wires 28, and a packaging glue 30. In some embodiments of the present invention, the image sensor 12 may be a complementary metal-oxide-semiconductor (CMOS) image sensor, the optical filter 26 may be an infrared cut-off (IR-Cut) filter, and the optical collimator 18 is a microelectromechanical systems (MEMS) structure. The supporting ring 20 may comprise polyimide (PI). The sealing glue 14, the insulation glue 16, and the packaging glue 30 may comprise epoxy resin, silicone, acrylic, or Tuffy adhesive, wherein Tuffy adhesive comprises styrene polymer. The optical filter 26 may comprise glass or plastic material. The optical filter 26 has a thickness of 0.03-0.5 mm.

The conductive wires 28 may comprise metal, silver, or copper. The image sensor 12 and the optical collimator 18 have a total thickness of 0.05-0.5 mm. The top of the flexible printed circuit board 10 is provided with a recess 32. The recess 32 does not penetrate through the flexible printed circuit board 10. The depth of the recess 32 may be 49 µm. The thickness of the flexible printed circuit board 10 under a dashed line may be 39 µm, but the present invention is not limited thereto. The image sensor 12 is formed on the flexible printed circuit board 10 and in the recess 32. An annular gap is formed between sidewalls of the image sensor 12 and the recess 32. The image sensor 12 is coupled to the flexible printed circuit board 10 through all the conductive wires 28. Each of the plurality of conductive wires has a thickness larger than 0 µm and less than 150 µm. The sealing glue 14 fills the annular gap and adheres to the flexible printed circuit board 10 and the image sensor 12. The width of the sealing glue 14 may be 150 µm. The insulation glue 16, formed on the image sensor 12, the flexible printed circuit board 10, and the sealing glue 14, encapsulates all the conductive wires 28. The insulation glue 16 has a thickness larger than 0 µm and less than 150 µm. The optical collimator 18 is formed on the image sensor 12. The supporting ring 20, formed on the flexible printed circuit board 10, surrounds the insulation glue 16 and the optical collimator 18. The height of the top of the supporting ring 20 is higher than the heights of the tops of all the conductive wires 28 and the top of the optical collimator 18. The thickness of the supporting ring 20 may be 125 µm. The sealant 22 and the stainless steel ring 24 are formed on the supporting ring 20. The stainless steel ring 24 surrounds the sealant 22. The height of the top of the stainless steel ring 24 is equal to the height of the top of the sealant 22. For example, the thickness of each of the sealant 22 and the stainless steel ring 24 is 100 µm. The optical filter 26 is formed on the sealant 22 and the stainless steel ring 24 and formed directly above the optical collimator 18 and the image sensor 12. Thus, the optical filter 26 shields the optical collimator 18 and the image sensor 12. Since the supporting ring 20 and the stainless steel ring 24 are harder than the sealant 22, the optical collimator 18 does not vibrate such that light is easily and accurately incident into the image sensor 12 through the optical collimator 18. The packaging glue 30, formed on the flexible printed circuit board 10, the stainless steel ring 24, the supporting ring 20, and the optical filter 26, covers the sidewalls of the supporting ring 20, the stainless steel ring 24, and the optical filter 26. The total thickness of the flexible printed circuit board 10, the supporting ring 20, the sealant 22, and the optical filter 26 is less than 335 µm. Besides, the total thickness of the flexible printed circuit board 10, the supporting ring 20, the sealant 22, and the optical filter 26 is larger than or equal to 325 µm.

Figure 2:
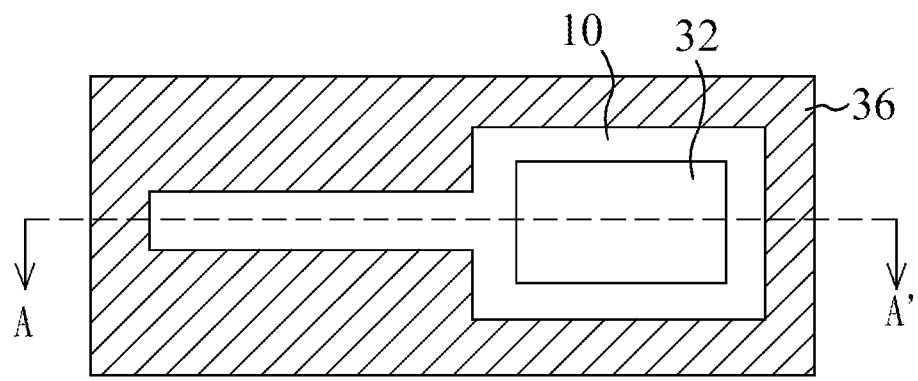
FIGS. 2-11 are top views of the steps of fabricating an optical image recognition device according to the first embodiment of the present invention.
Figure 3:
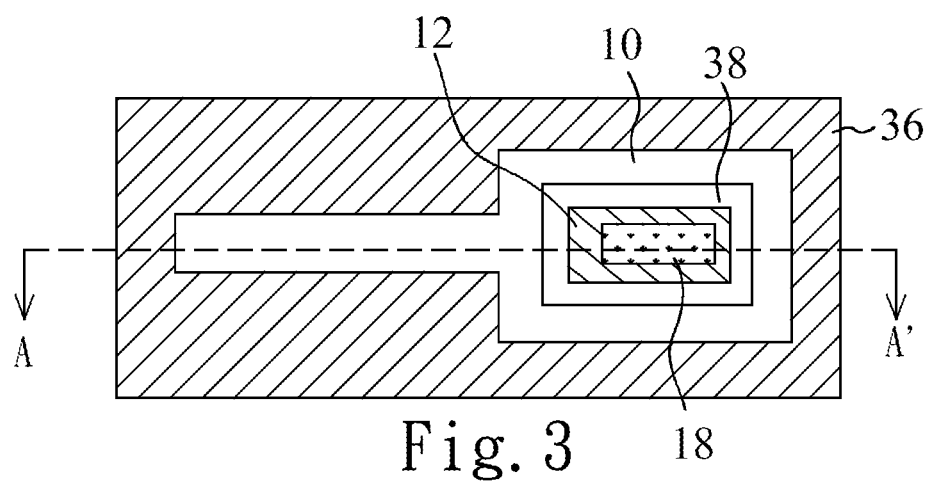
Figure 4:
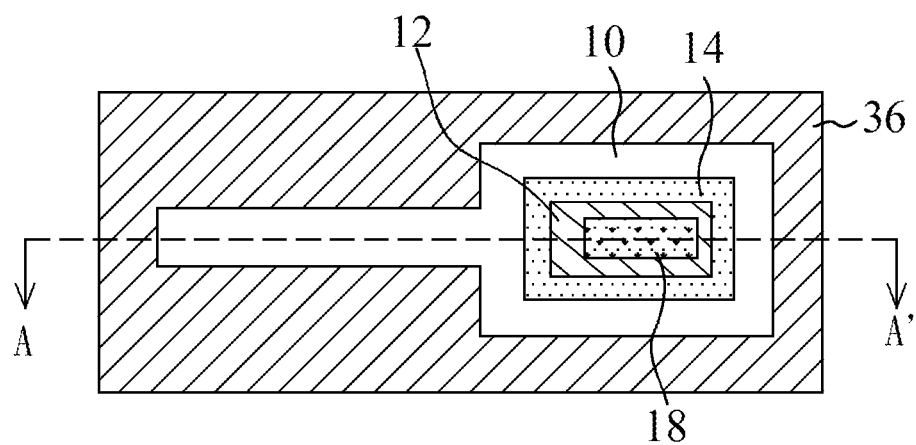
Figure 5:
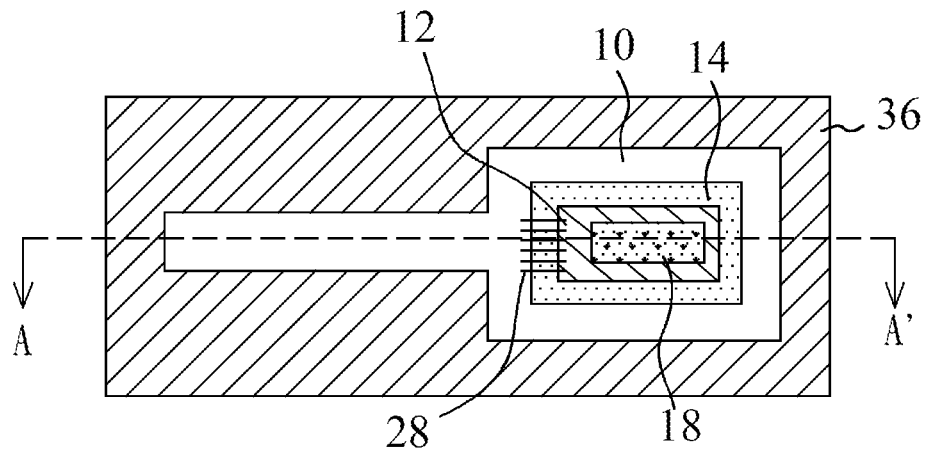
Figure 6:
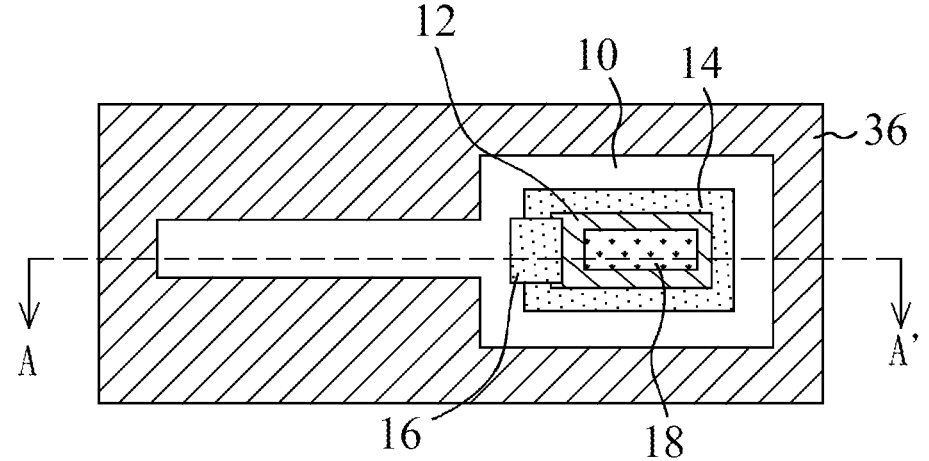
Figure 7:
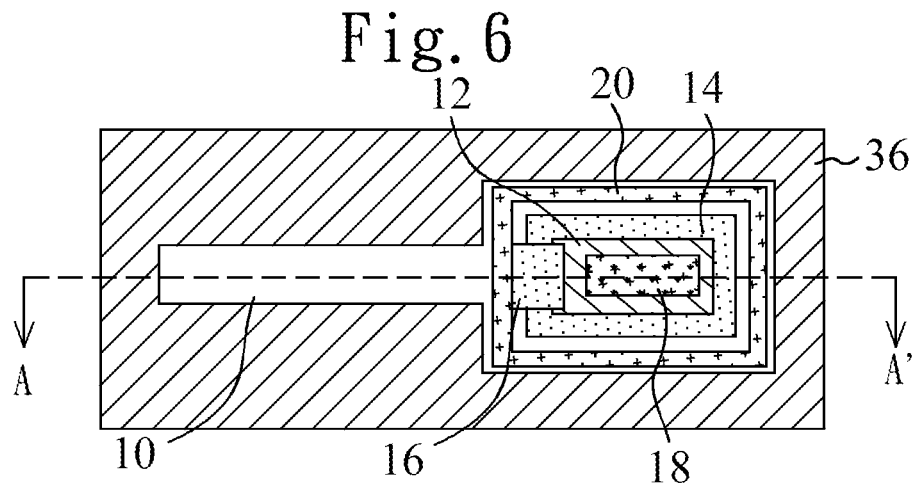
Figure 8:
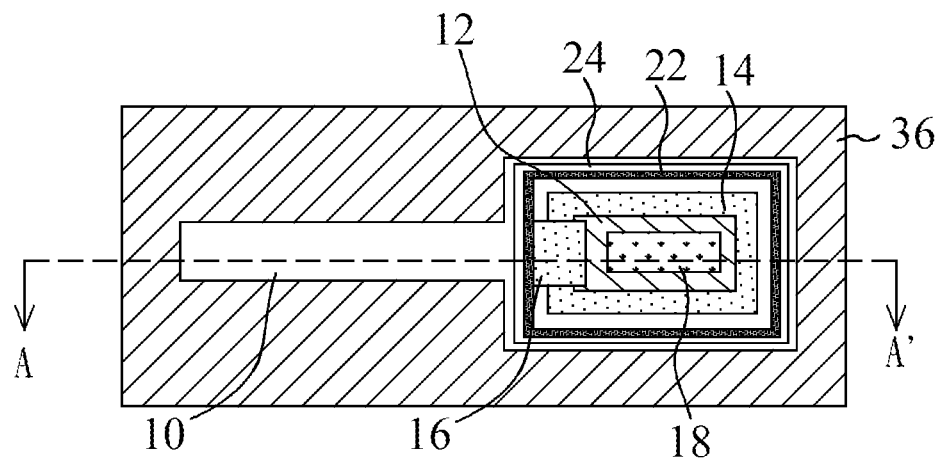
Figure 9:
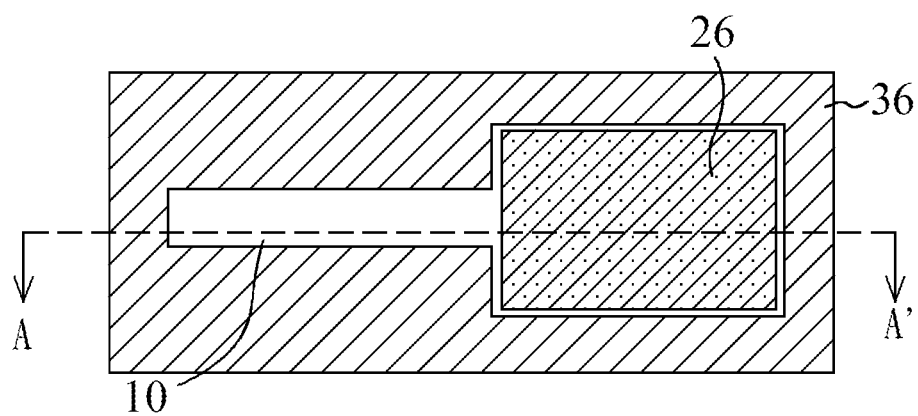
Figure 10:
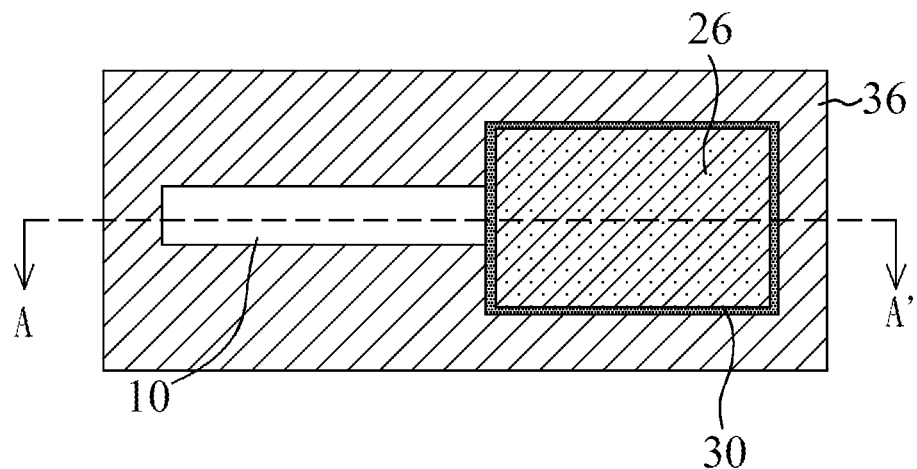
Figure 11:
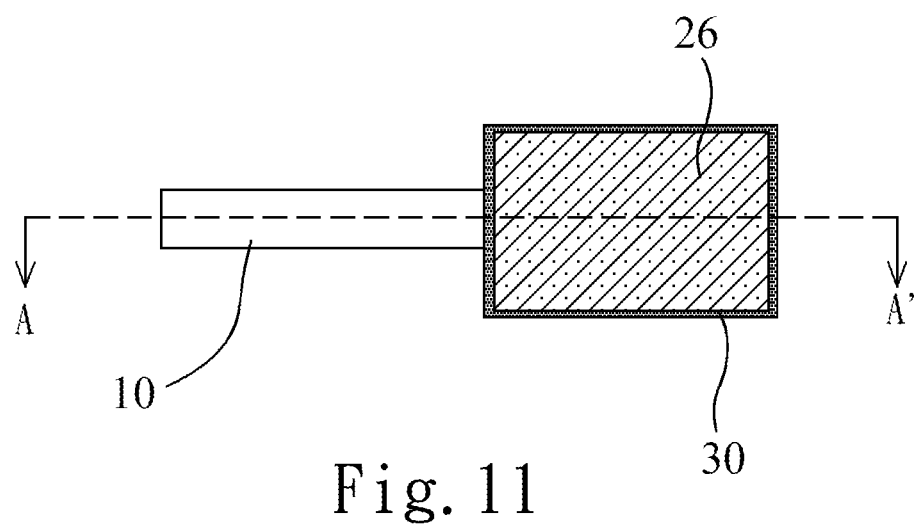
Figure 12:
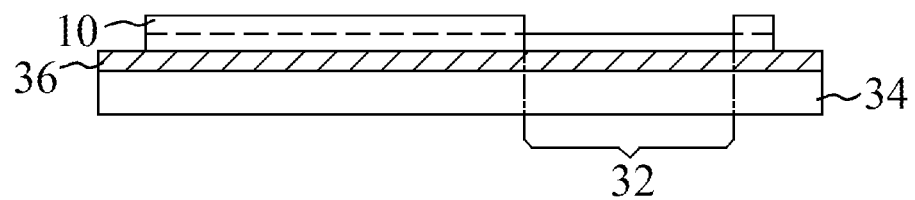
FIGS. 12-21 are sectional views of the steps of fabricating an optical image recognition device according to the first embodiment of the present invention.
Figure 13:
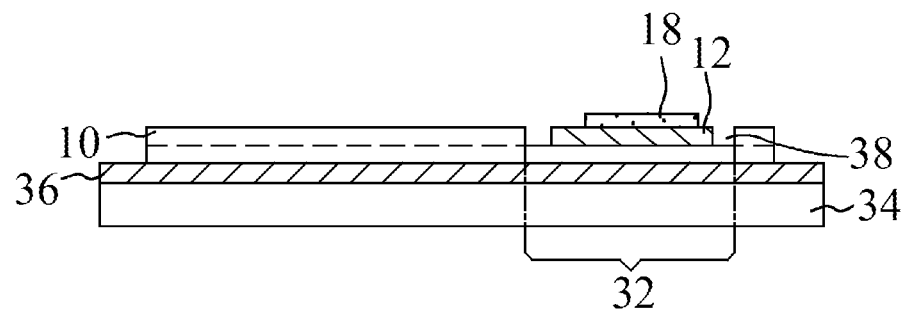
Figure 14:
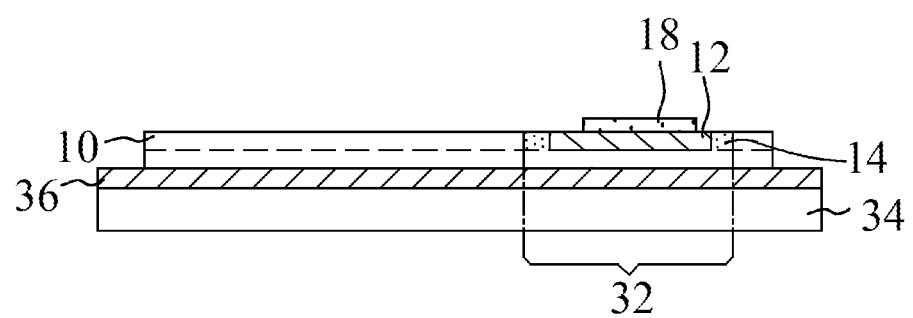
Figure 15:
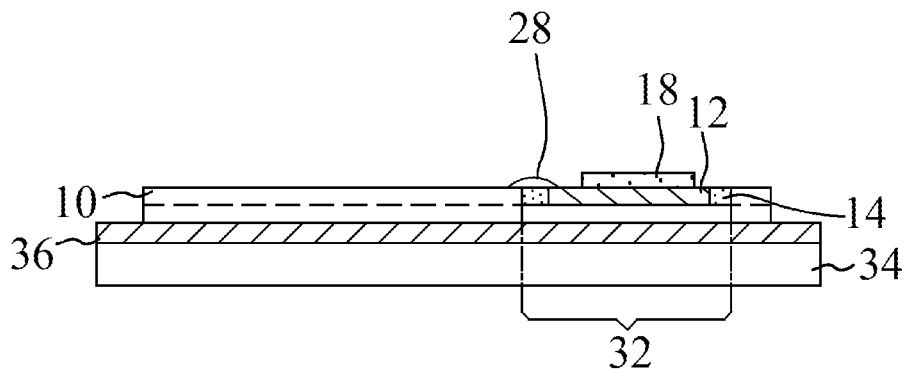
Figure 16:
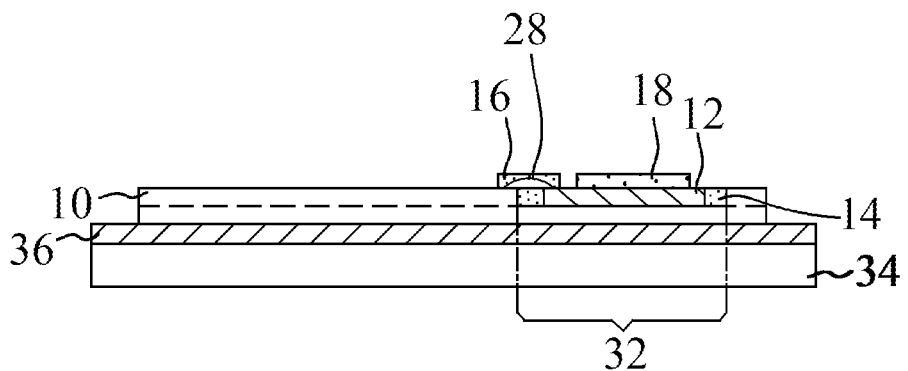
Figure 17:
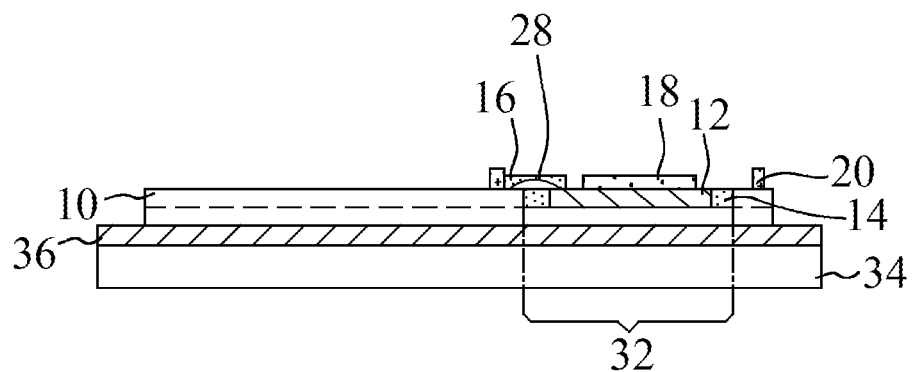
Figure 18:
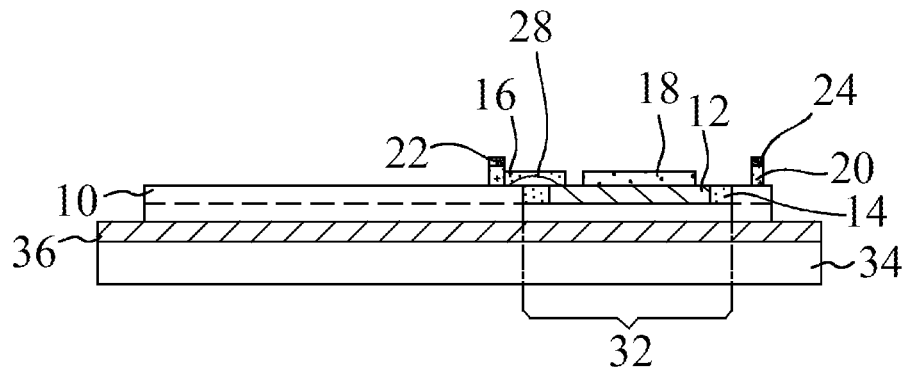
Figure 19:
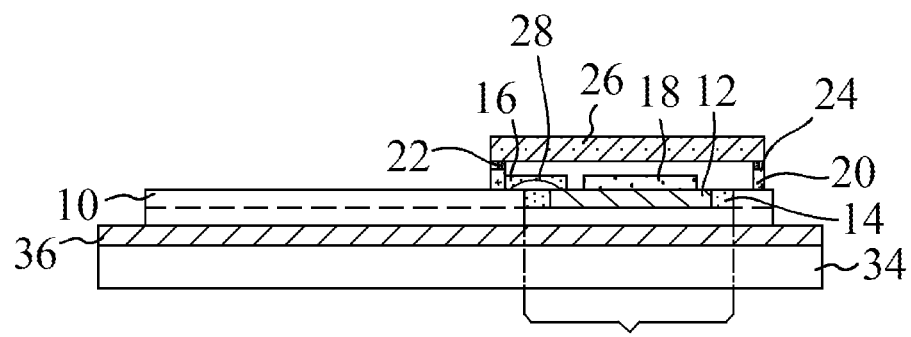
Figure 20:
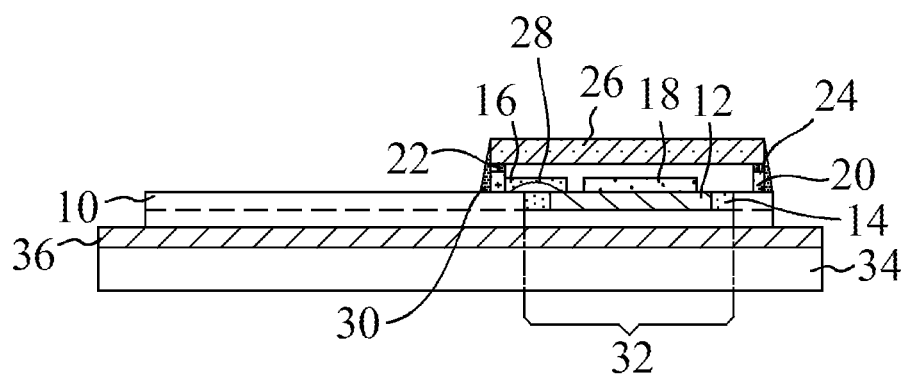
Figure 21:
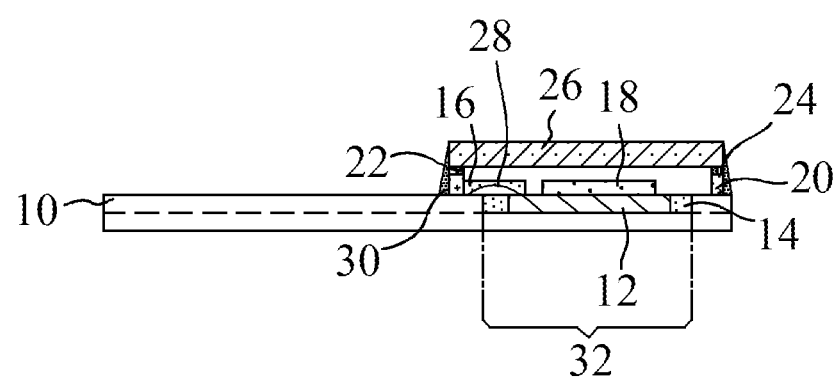

Refer to FIGS. 2-21. The present invention introduces the method for fabricating the optical image recognition device according to the first embodiment. FIGS. 12-21 are respectively sectional views of FIGS. 2-11 taken along Line A-A'. As shown in FIG. 2 and FIG. 12, a substrate 34 is firstly provided, wherein the substrate 34 is provided with a thermal release film 36 thereon. In some embodiment of the present invention, the substrate 34 may comprise glass, ceramic, polyimide (PI), quartz, sapphire, or polyethylene terephthalate. Then, the flexible printed circuit board 10 is formed on the thermal release film 36. In order to reduce the total thickness, the top of the flexible printed circuit board 10 is provided with the recess 32. Then, as shown in FIG. 3 and FIG. 13, the image sensor 12 is formed on the flexible printed circuit board 10 and in the recess 32. An annular gap 38 is formed between the sidewalls of the image sensor 12 and the recess 32. The optical collimator 18 is formed on the image sensor 12. Afterwards, as shown in FIG. 4 and FIG. 14, the sealing glue 14, which is formed in the annular gap 38, adheres to the flexible printed circuit board 10 and the image sensor 12. Then, as shown in FIG. 5 and FIG. 15, the plurality of conductive wires 28 are formed on the flexible printed circuit board 10 and the image sensor 12 and electrically connected to the flexible printed circuit board 10 and the image sensor 12. Next, as shown in FIG. 6 and FIG. 16, the insulation glue 16, which is formed on the image sensor 12, the flexible printed circuit board 10, and the sealing glue 14, encapsulates all the conductive wires 28. Then, as shown in FIG. 7 and FIG. 17, the supporting ring 20, which is formed on the flexible printed circuit board 10, surrounds the insulation glue 16 and the optical collimator 18. The height of the top of the supporting ring 20 is higher than the heights of the tops of all the conductive wires 28 and the top of the optical collimator 18. Then, as shown in FIG. 8 and FIG. 18, the sealant 22 and the stainless steel ring 24 are formed on the supporting ring 20, such that the stainless steel ring 24 surrounds the sealant 22. Then, as shown in FIG. 9 and FIG. 19, the optical filter 26, which is formed on the sealant 22 and the stainless steel ring 24, shields the optical collimator 18 and the image sensor 12. Then, as shown in FIG. 10 and FIG. 20, the packaging glue 30, which is formed on the flexible printed circuit board 10, the stainless steel ring 24, the supporting ring 20, and the optical filter 26, covers the sidewalls of the supporting ring 20, the stainless steel ring 24, and the optical filter 26. Finally, as shown in FIG. 11 and FIG. 21, the substrate 34 and the thermal release film 36 are removed from the flexible printed circuit board 10, thereby reducing the total thickness of the recognition device.

In the method of the first embodiment, the steps of FIG. 13 and FIG. 14 are performed in one step. That is to say, the steps of forming the image sensor 12 in the recess 32, forming the optical collimator 18 on the image sensor 12, and forming the sealing glue 14 in the annular gap 38 are simultaneously performed to adhere to the flexible printed circuit board 10 and the image sensor 12.

In the structure of the first embodiment, the stainless steel ring 24 may be omitted. Thus, the packaging glue 30, formed on the flexible printed circuit board 10, the sealant 22, the supporting ring 20, and the optical filter 26, covers the sidewalls of the supporting ring 20, the sealant 22, and the optical filter 26. In addition, in the step of FIG. 18, only the sealant 22 is formed on the supporting ring 20. In the step of FIG. 20, the packaging glue 30, which is formed on the flexible printed circuit board 10, the sealant 22, the supporting ring 20, and the optical filter 26, covers the sidewalls of the supporting ring 20, the sealant 22, and the optical filter 26. On top of that, in the structure of the first embodiment, the packaging glue 30 may be omitted and the step of FIG. 20 may be deleted.

Figure 22:
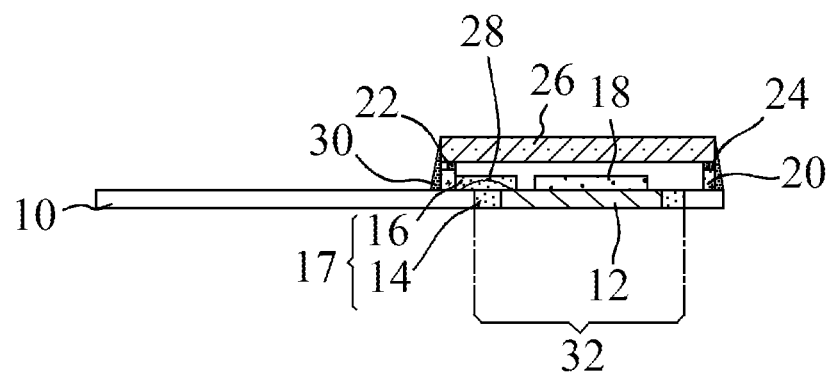
FIG. 22 is a sectional view of an optical image recognition device according to the second embodiment of the present invention.

Refer to FIG. 22. The second embodiment of the optical image recognition device is introduced as follows. The second embodiment is different from the first embodiment in the recess 32. In the second embodiment, the recess 32 penetrates through the flexible printed circuit board 10. The height of the bottom of the image sensor 12 is equal to the height of the bottom of the flexible printed circuit board 10. The thickness of the flexible printed circuit board 10 may be 88 μm. Only using the sealing glue 14, the image sensor 12 is fixed to the flexible printed circuit board 10. Compared with the first embodiment, the total thickness of the second embodiment of the optical image recognition device is thinner since the recess 32 completely penetrates through the flexible printed circuit board 10.

Figure 23:
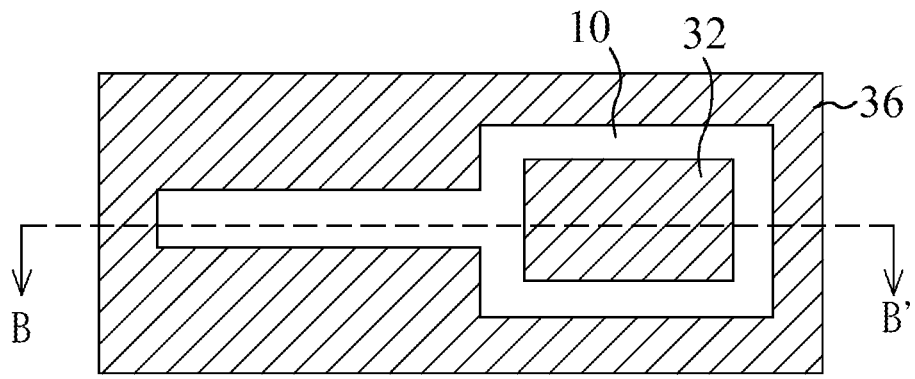
FIGS. 23-32 are top views of the steps of fabricating an optical image recognition device according to the second embodiment of the present invention.
Figure 24:
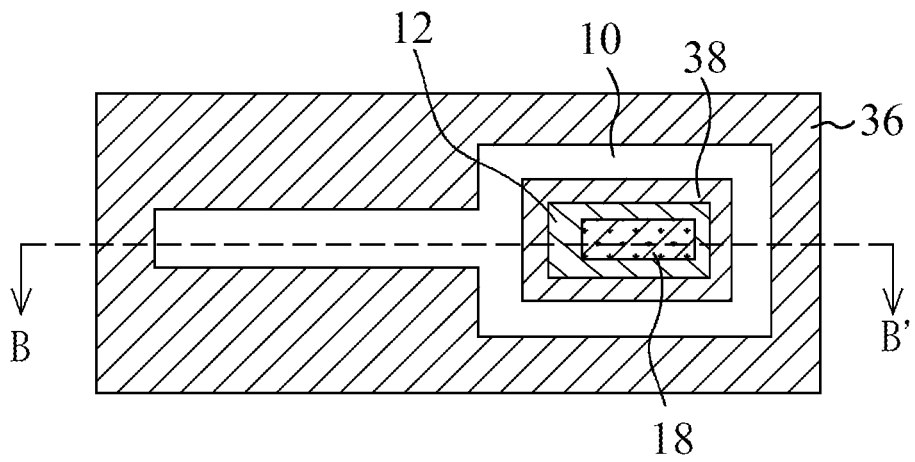
Figure 25:
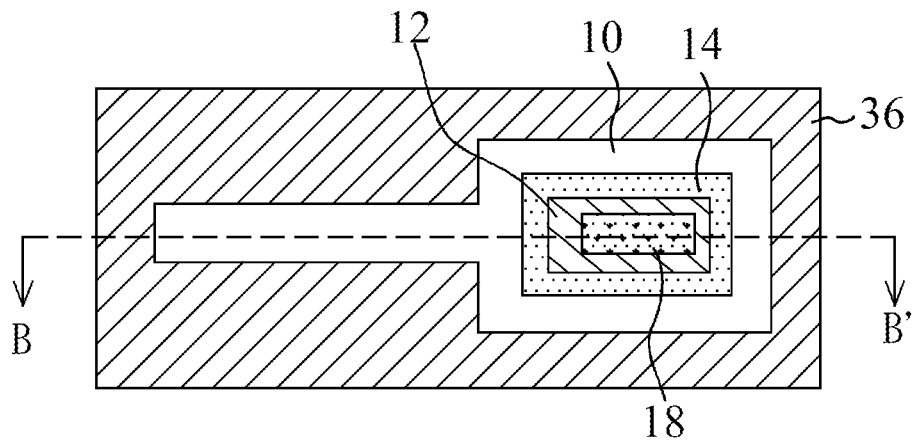
Figure 26:
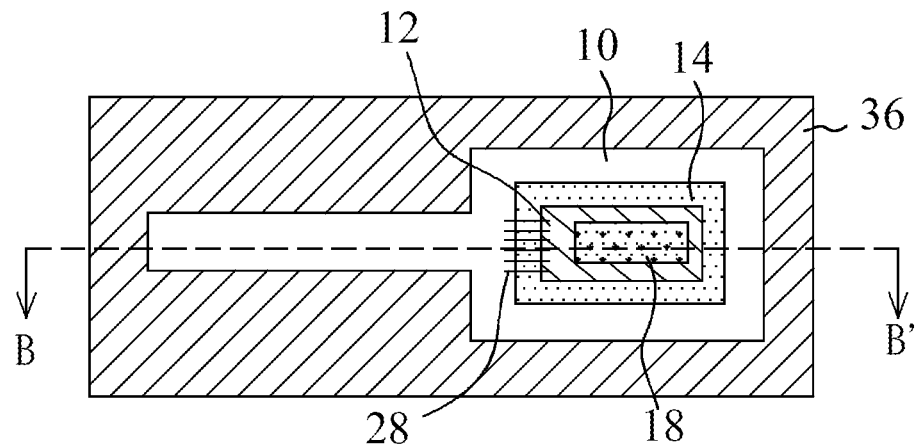
Figure 27:
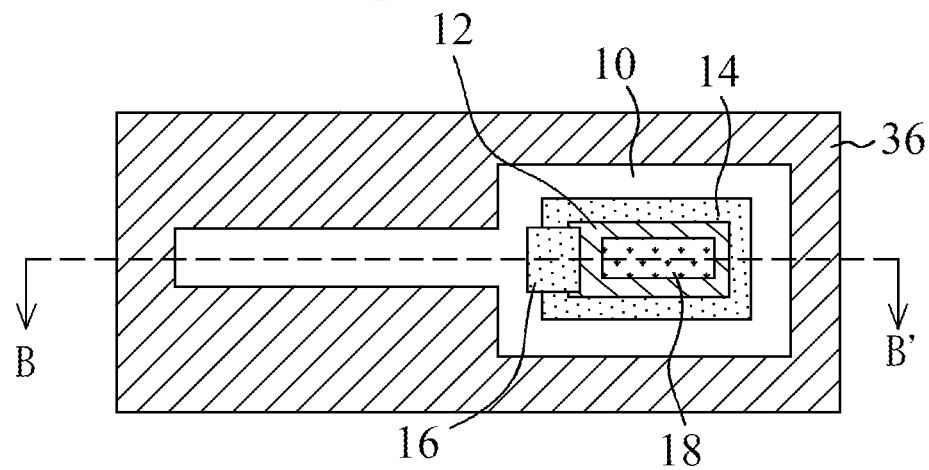
Figure 28:
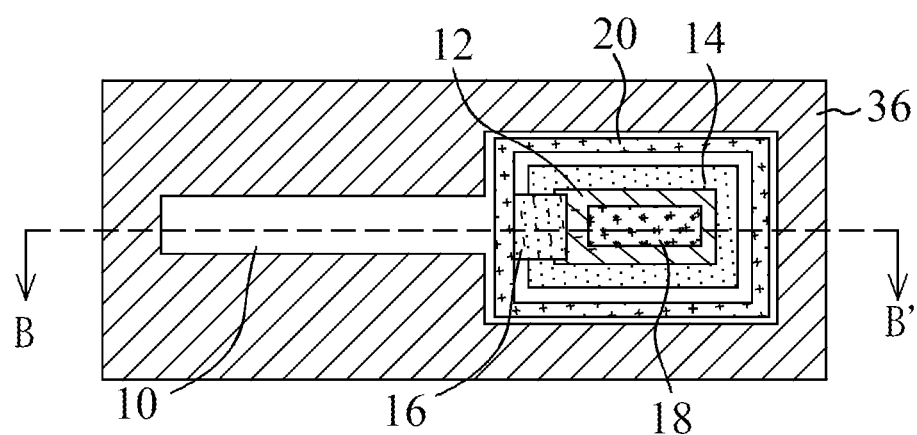
Figure 29:
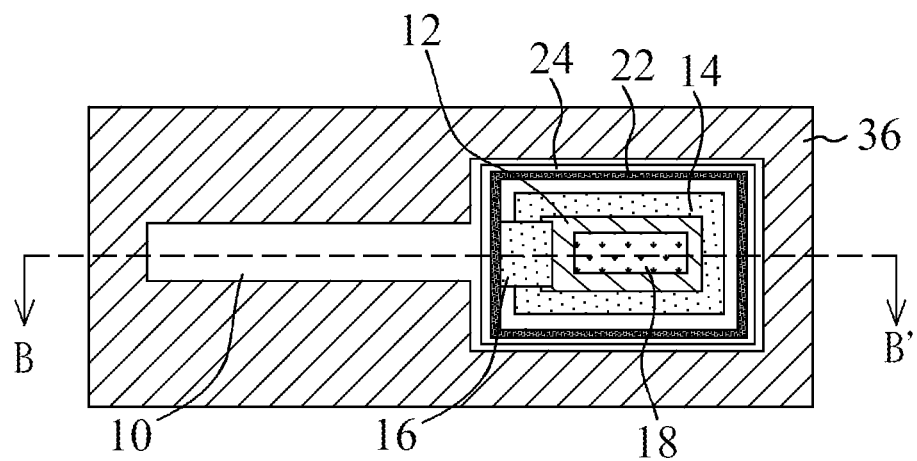
Figure 30:
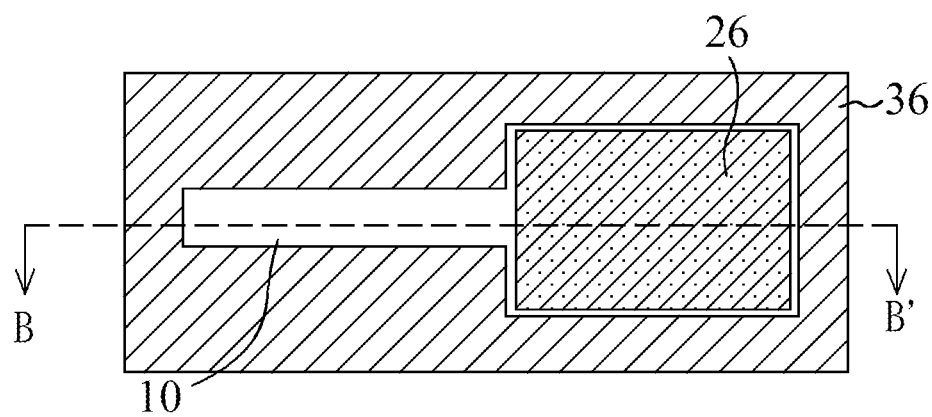
Figure 31:
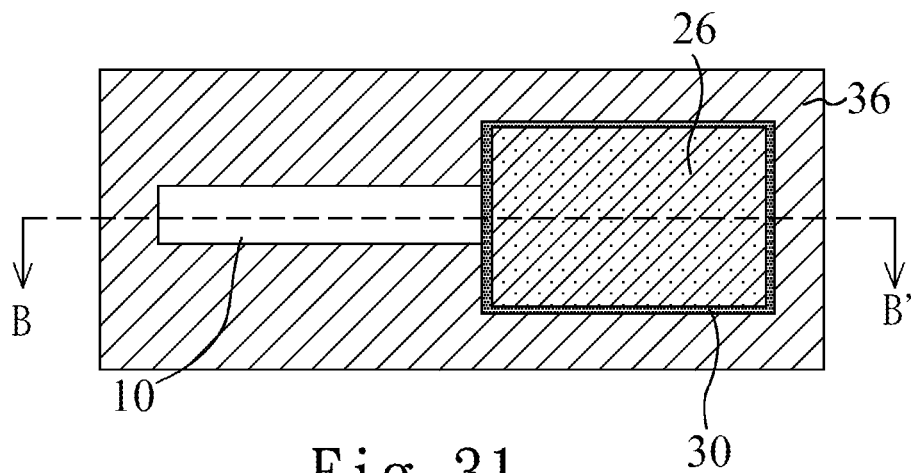
Figure 32:
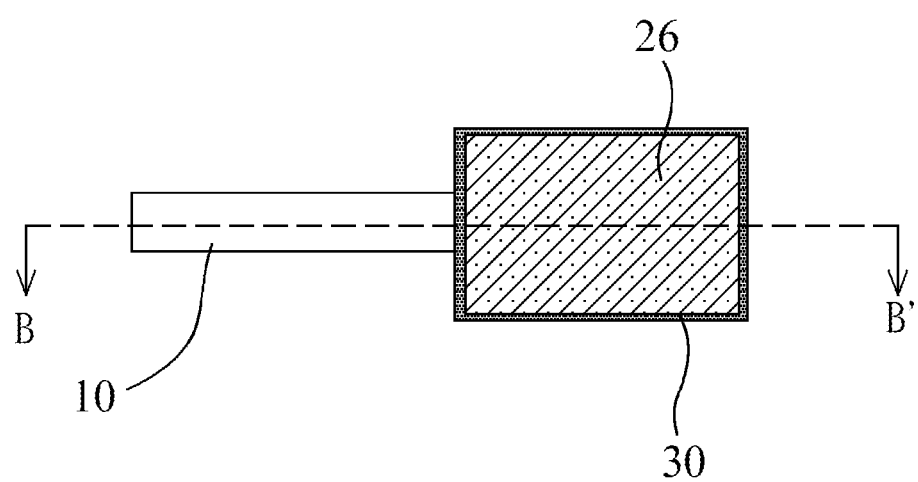
Figure 33:
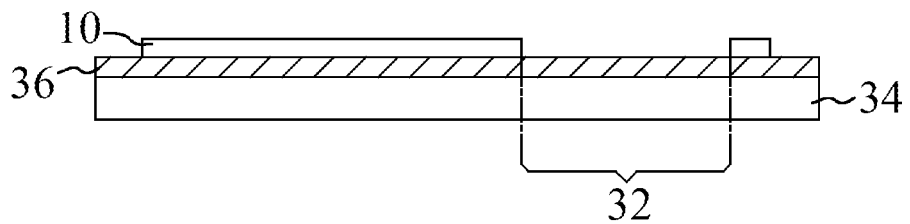
FIGS. 33-42 are sectional views of the steps of fabricating an optical image recognition device according to the second embodiment of the present invention.
Figure 34:
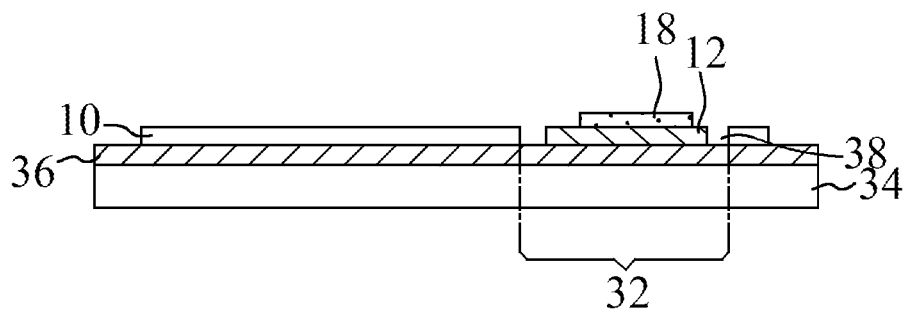
Figure 35:
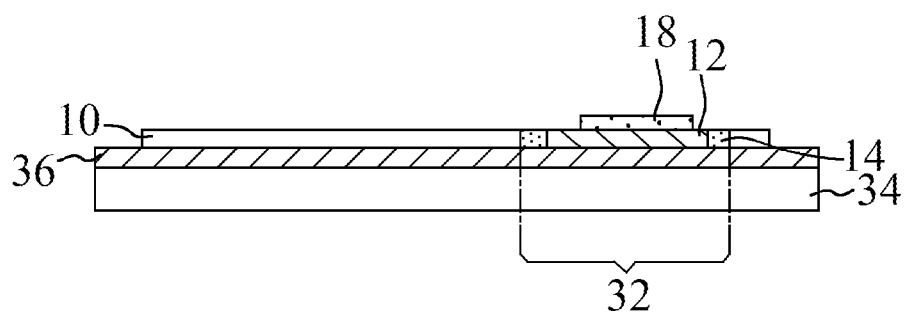
Figure 36:
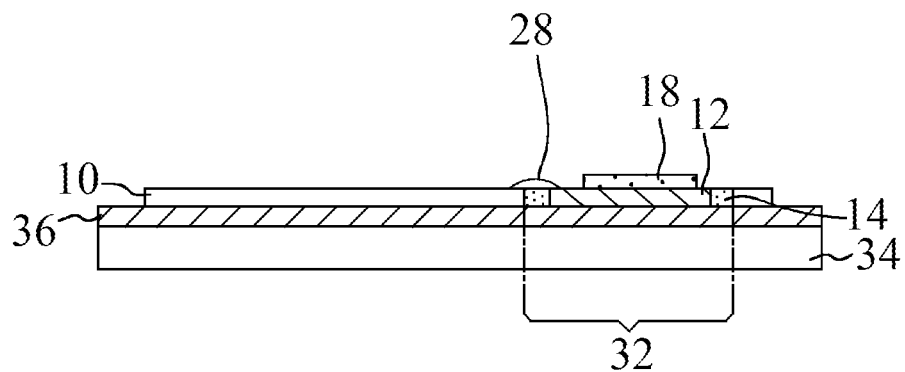
Figure 37:
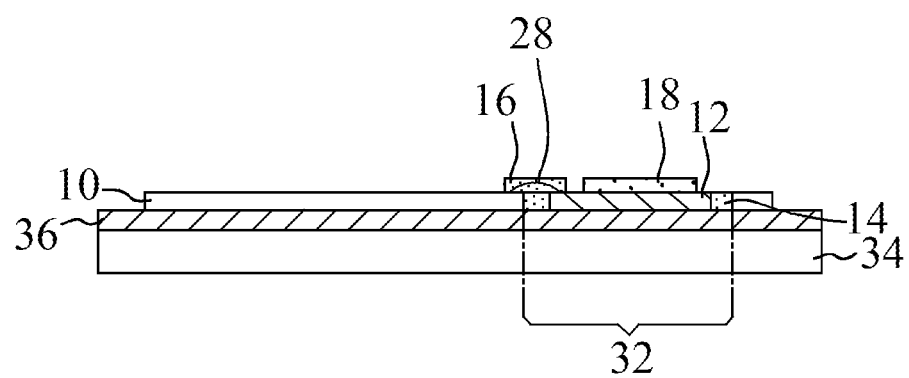
Figure 38:
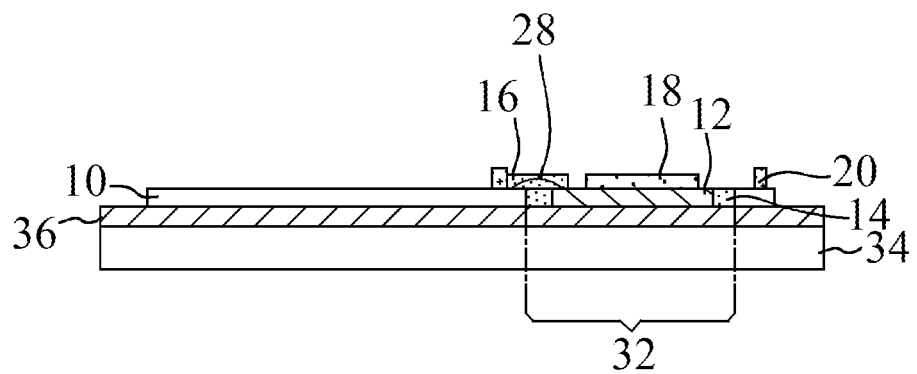
Figure 39:
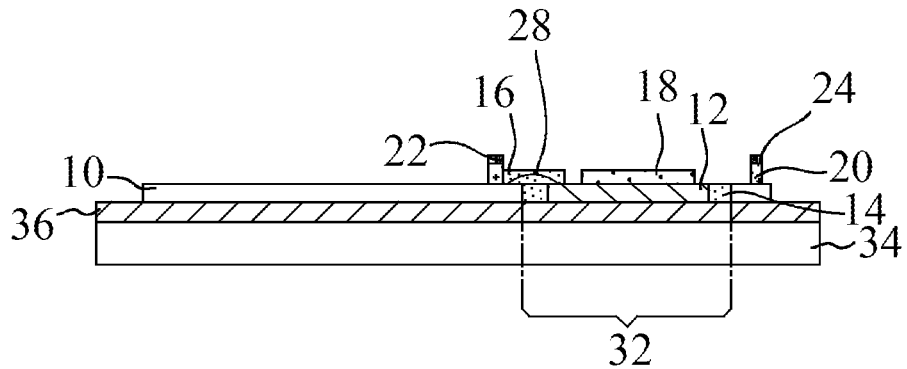
Figure 40:
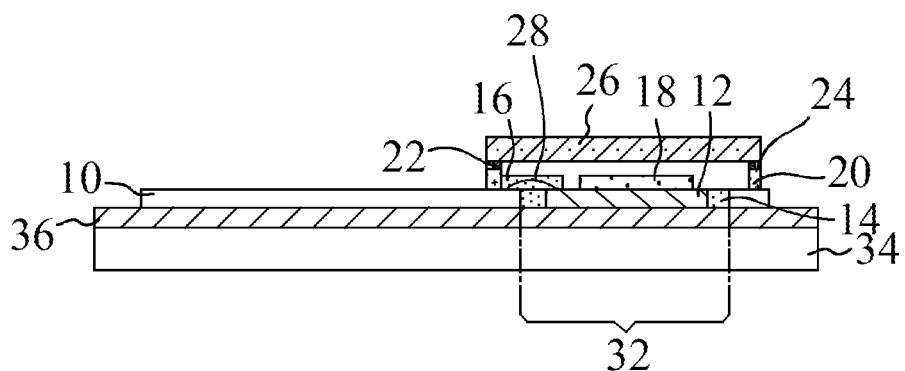
Figure 41:
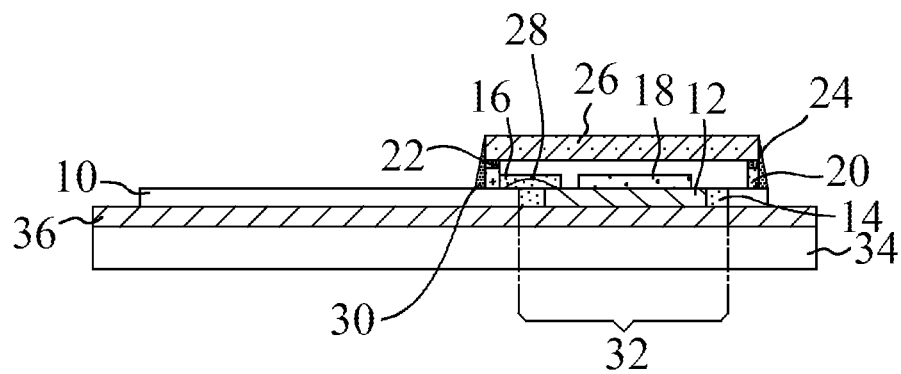
Figure 42:
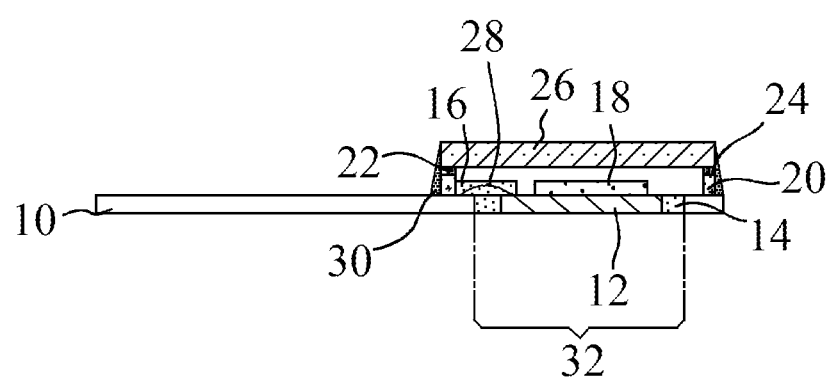

Refer to FIGS. 23-42. The present invention introduces the method for fabricating the optical image recognition device according to the second embodiment. FIGS. 33-42 are respectively sectional views of FIGS. 23-32 taken along Line B-B'. As shown in FIG. 23 and FIG. 33, a substrate 34 is firstly provided, wherein the substrate 34 is provided with a thermal release film 36 thereon. In some embodiment of the present invention, the substrate 34 may comprise glass, ceramic, polymide (PI), quartz, sapphire, or polyethylene terephthalate. Then, the flexible printed circuit board 10 is formed on the thermal release film 36. In order to reduce the total thickness, the flexible printed circuit board 10 is penetrated with the recess 32. Then, as shown in FIG. 24 and FIG. 34, the image sensor 12 is formed in the recess 32. An annular gap 38 is formed between the sidewalls of the image sensor 12 and the recess 32. The optical collimator 18 is formed on the image sensor 12. Afterwards, as shown in FIG. 25 and FIG. 35, the sealing glue 14, which is formed in the annular gap 38, adheres to the flexible printed circuit board 10 and the image sensor 12. Then, as shown in FIG. 26 and FIG. 36, the plurality of conductive wires 28 are formed on the flexible printed circuit board 10 and the image sensor 12 and electrically connected to the flexible printed circuit board 10 and the image sensor 12. Next, as shown in FIG. 27 and FIG. 37, the insulation glue 16, which is formed on the image sensor 12, the flexible printed circuit board 10, and the sealing glue 14, encapsulates all the conductive wires 28. Then, as shown in FIG. 28 and FIG. 38, the supporting ring 20, which is formed on the flexible printed circuit board 10, surrounds the insulation glue 16 and the optical collimator 18. The height of the top of the supporting ring 20 is higher than the heights of the tops of all the conductive wires 28 and the top of the optical collimator 18. Then, as shown in FIG. 29 and FIG. 39, the sealant 22 and the stainless steel ring 24 are formed on the supporting ring 20, such that the stainless steel ring 24 surrounds the sealant 22. Then, as shown in FIG. 30 and FIG. 40, the optical filter 26, which is formed on the sealant 22 and the stainless steel ring 24, shields the optical collimator 18 and the image sensor 12. Then, as shown in FIG. 31 and FIG. 41, the packaging glue 30, which is formed on the flexible printed circuit board 10, the stainless steel ring 24, the supporting ring 20, and the optical filter 26, covers the sidewalls of the supporting ring 20, the stainless steel ring 24, and the optical filter 26. Finally, as shown in FIG. 32 and FIG. 42, the substrate 34 and the thermal release film 36 are removed from the flexible printed circuit board 10, the sealing glue 14, and the image sensor 12, thereby reducing the total thickness of the recognition device.

In the method of the second embodiment, the steps of FIG. 34 and FIG. 35 are performed in one step. That is to say, the steps of forming the image sensor 12 in the recess 32, forming the optical collimator 18 on the image sensor 12, and forming the sealing glue 14 in the annular gap 38 are simultaneously performed to adhere to the flexible printed circuit board 10 and the image sensor 12.

In the structure of the second embodiment, the stainless steel ring 24 may be omitted. Thus, the packaging glue 30, formed on the flexible printed circuit board 10, the sealant 22, the supporting ring 20, and the optical filter 26, covers the sidewalls of the supporting ring 20, the sealant 22, and the optical filter 26. In addition, in the step of FIG. 39, only the sealant 22 is formed on the supporting ring 20. In the step of FIG. 40, the packaging glue 30, which is formed on the flexible printed circuit board 10, the sealant 22, the supporting ring 20, and the optical filter 26, covers the sidewalls of the supporting ring 20, the sealant 22, and the optical filter 26. On top of that, in the structure of the second embodiment, the packaging glue 30 may be omitted and the step of FIG. 40 may be deleted.

Figure 43:
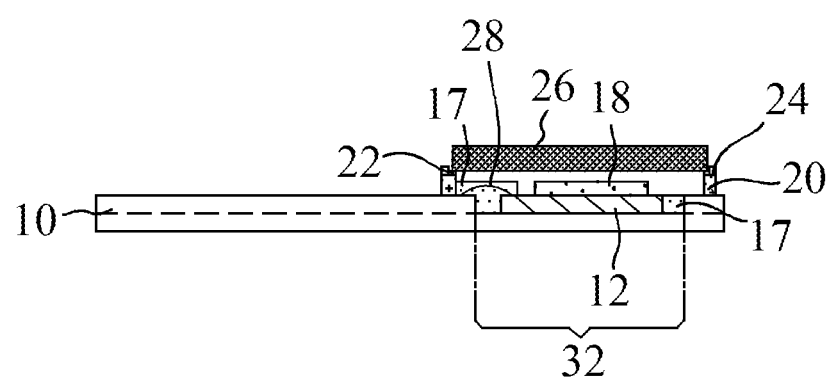
FIG. 43 is a sectional view of an optical image recognition device according to the third embodiment of the present invention.

Refer to FIG. 43. The third embodiment of the optical image recognition device is introduced as follows. The optical image recognition device comprises a flexible printed circuit board 10, an image sensor 12, a glue 17, an optical collimator 18, a supporting ring 20, a sealant 22, a stainless steel ring 24, an optical filter 26, and a plurality of conductive wires 28. In some embodiments of the present invention, the image sensor 12 may be a complementary metal-oxide-semiconductor (CMOS) image sensor, the optical filter 26 may be an infrared cut-off (IR-Cut) filter, and the optical collimator 18 is a microelectromechanical systems (MEMS) structure. The supporting ring 20 may comprise polyimide (PI). The glue 17 and the sealant 22 may comprise epoxy resin, silicone, acrylic, or Tuffy adhesive, wherein Tuffy adhesive comprises styrene polymer. The optical filter 26 may comprise glass or plastic material. The optical filter 26 has a thickness of 0.03-0.5 mm, preferably 110 μm. The conductive wires 28 may comprise metal, silver, or copper. The image sensor 12 and the optical collimator 18 have a total thickness of 0.05-0.5 mm. Preferably, the image sensor 12 has a thickness of 60 μm and the optical collimator 18 has a thickness of 50 μm. The top of the flexible printed circuit board 10 is provided with a recess 32. The recess 32 does not penetrate through the flexible printed circuit board 10. The depth of the recess 32 may be 49 μm. The thickness of the flexible printed circuit board 10 under a dashed line may be 39 μm, but the present invention is not limited thereto. The image sensor 12 may be formed on the flexible printed circuit board 10 through a glue and in the recess 32. In the third embodiment, the image sensor 12 is formed on the flexible printed circuit board 10 without using a glue. An annular gap is formed between sidewalls of the image sensor 12 and the recess 32. Preferably, the width of the annular gap is 170 μm. The image sensor 12 is coupled to the flexible printed circuit board 10 through all the conductive wires 28. Each of the plurality of conductive wires has a thickness larger than 0 μm and less than 150 μm, preferably less than 80 μm. The glue 17 fills the annular gap and adheres to the flexible printed circuit board 10 and the image sensor 12. The width of the annular gap may be 150-170 μm. The glue 17, formed on the image sensor 12 and the flexible printed circuit board 10, encapsulates all the conductive wires 28. The glue 17 has a thickness larger than 0 μm and less than 150 μm. The optical collimator 18 is formed on the image sensor 12. The supporting ring 20, formed on the flexible printed circuit board 10, surrounds the glue 17 and the optical collimator 18. The height of the top of the supporting ring 20 is higher than the heights of the tops of all the conductive wires 28 and the top of the optical collimator 18. The thickness of the supporting ring 20 may be 125 μm. The sealant 22 and the stainless steel ring 24 are formed on the supporting ring 20. The stainless steel ring 24 surrounds the sealant 22. The height of the top of the stainless steel ring 24 is higher than the height of the top of the sealant 22. For example, the thickness of the stainless steel ring 24 is 100 μm and the thickness of the sealant 22 is 10 μm. The optical filter 26 is formed on the sealant 22 and formed directly above the optical collimator 18 and the image sensor 12. Thus, the optical filter 26 shields the optical collimator 18 and the image sensor 12. A distance between the optical filter 26 and the stainless steel ring 24 may be 0.05-2 mm. The stainless steel ring 24 surrounds the optical filter 26. Preferably, the thickness of the optical filter 26 is 110 μm. Since the supporting ring 20 and the stainless steel ring 24 are harder than the sealant 22, the optical filter 26 does not vibrate such that light is easily and accurately incident into the image sensor 12 through the optical collimator 18. Owning to the supporting ring 20 and the stainless steel ring 24, the flexible printed circuit board 10 becomes harder. The total thickness of the flexible printed circuit board 10, the supporting ring 20, the sealant 22, and the optical filter 26 is less than 335 μm. Besides, the total thickness of the flexible printed circuit board 10, the supporting ring 20, the sealant 22, and the optical filter 26 is larger than or equal to 325 μm.

Figure 44:
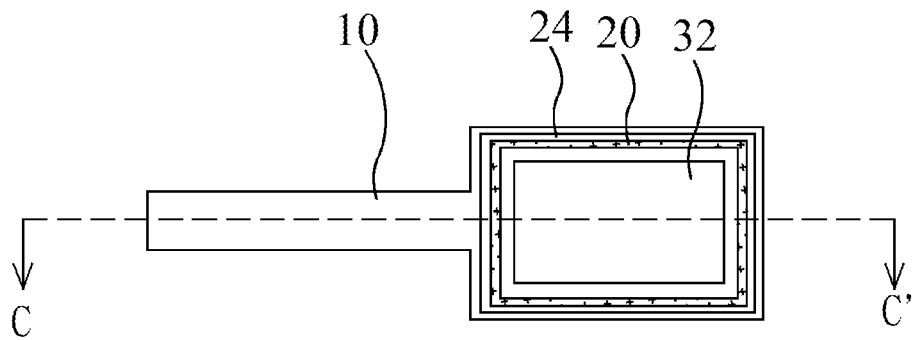
FIGS. 44-49 are top views of the steps of fabricating an optical image recognition device according to the third embodiment of the present invention.
Figure 45:
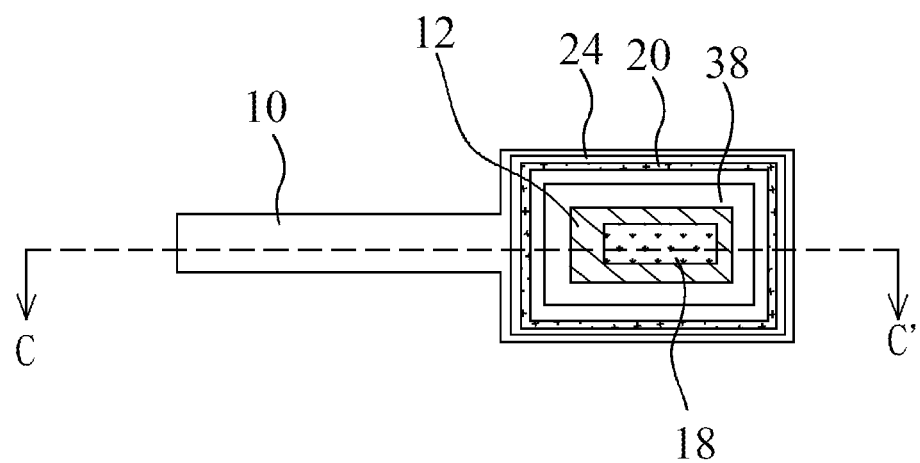
Figure 48:
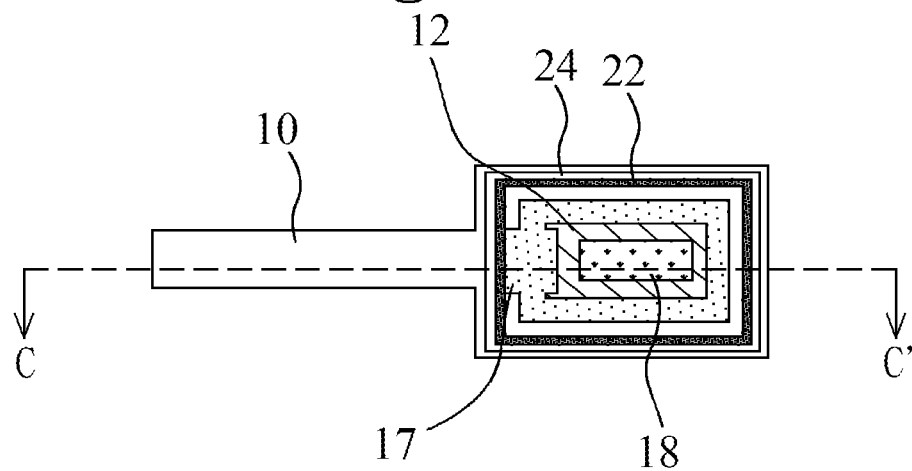
Figure 49:
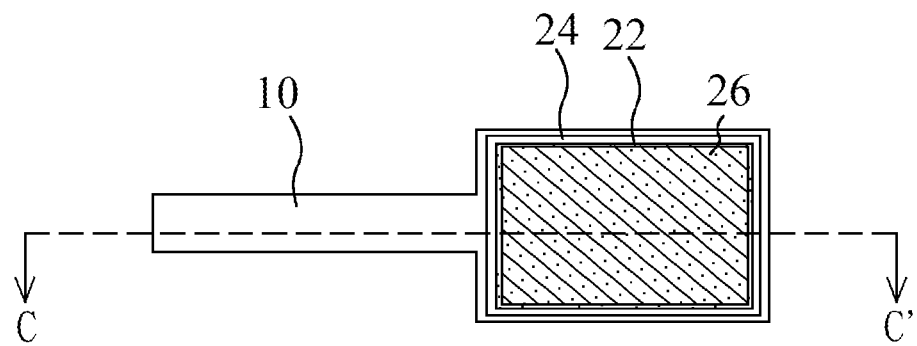
Figure 50:
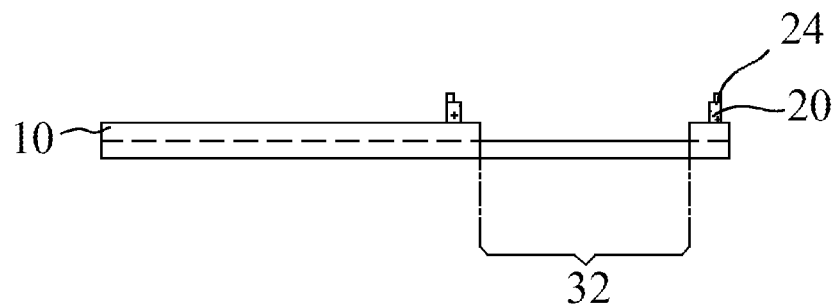
FIGS. 50-55 are sectional views of the steps of fabricating an optical image recognition device according to the third embodiment of the present invention.
Figure 51:
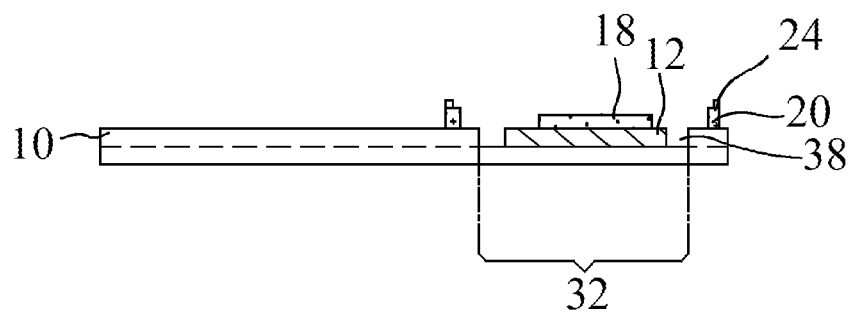

Refer to FIGS. 44-55. The present invention introduces the method for fabricating the optical image recognition device according to the third embodiment. FIGS. 50-55 are respectively sectional views of FIGS. 44-49 taken along Line C-C'. As shown in FIG. 44 and FIG. 50, the flexible printed circuit board 10 is provided. In order to reduce the total thickness, the top of the flexible printed circuit board 10 is provided with the recess 32 and the supporting ring 20, the supporting ring 20 is provided with the stainless steel ring 24 thereon, the sidewalls of the supporting ring 20 and the recess 32 are separated from each other, and the stainless steel ring 24 separates from the inner sidewall of the supporting ring 20. Then, as shown in FIG. 45 and FIG. 51, the image sensor 12 is formed on the flexible printed circuit board 10 and in the recess 32.

Figure 46:
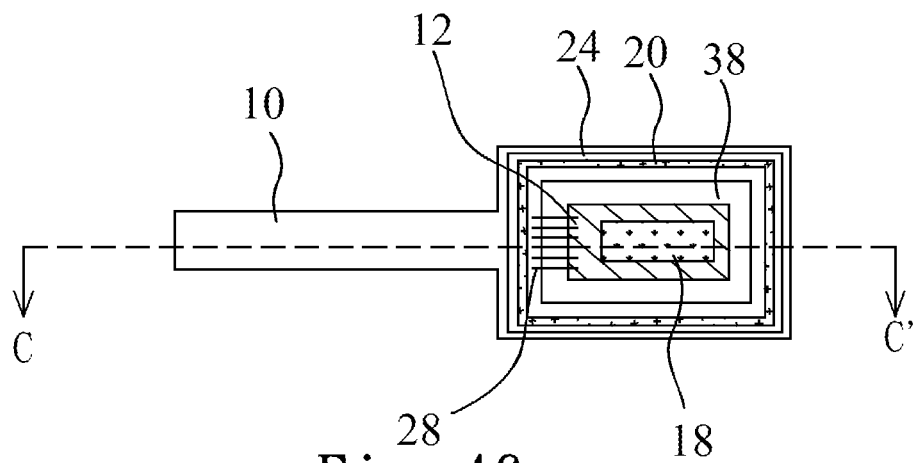
Figure 47:
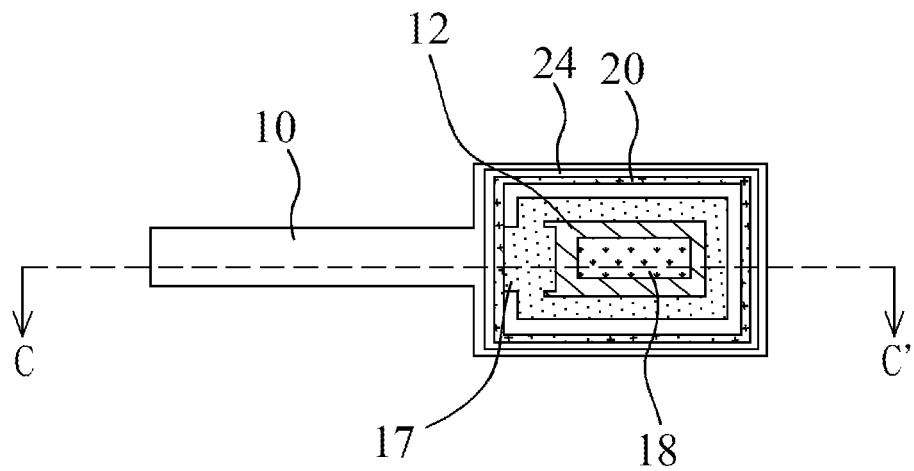
Figure 52:
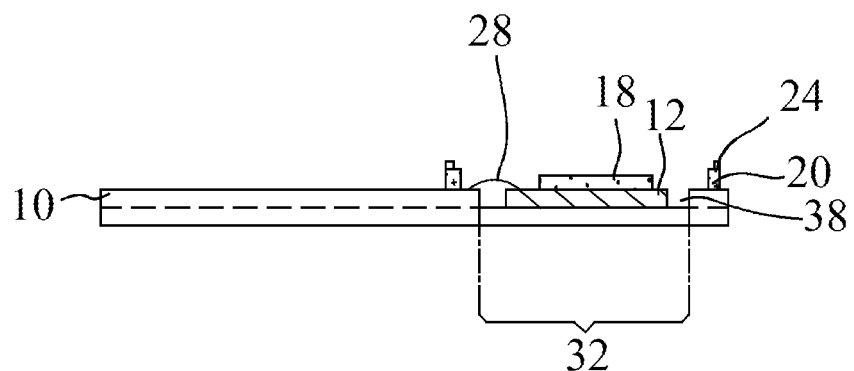
Figure 53:
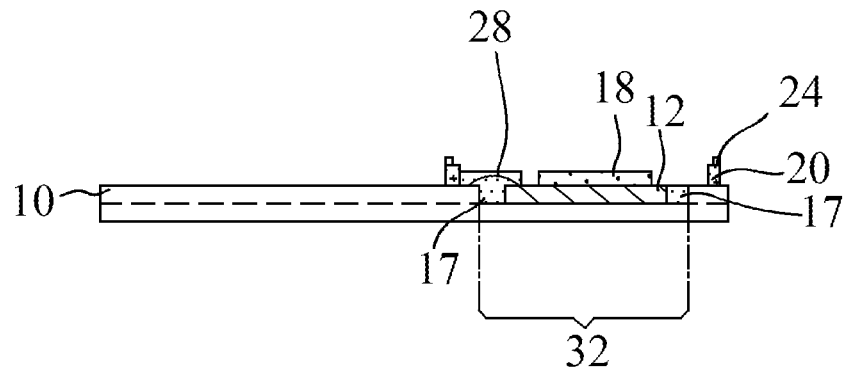
Figure 54:
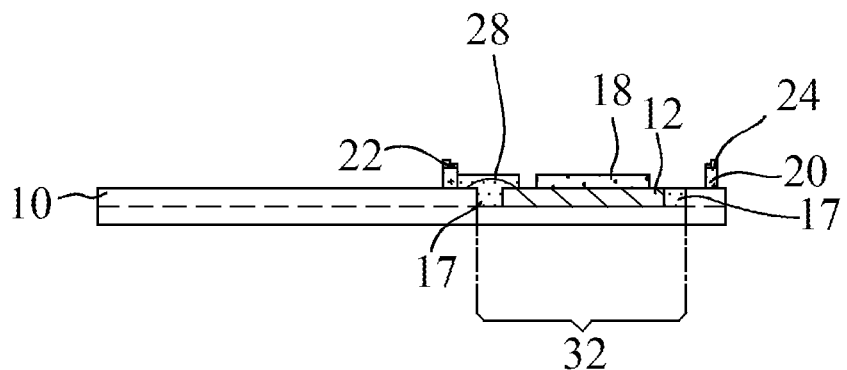
Figure 55:
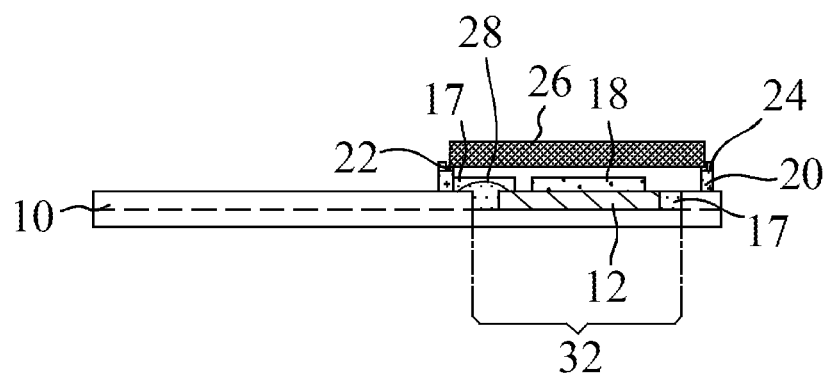

An annular gap 38 is formed between the sidewalls of the image sensor 12 and the recess 32. The optical collimator 18 is formed on the image sensor 12. Afterwards, as shown in FIG. 46 and FIG. 52, the plurality of conductive wires 28 are formed on the flexible printed circuit board 10 and the image sensor 12 and electrically connected to the flexible printed circuit board 10 and the image sensor 12. Then, as shown in FIG. 47 and FIG. 53, the glue 17, which is formed in the annular gap 38 and on the image sensor 12 and the flexible printed circuit board 10, adheres to the flexible printed circuit board 10 and the image sensor 12 and encapsulates all the conductive wires 28. Next, as shown in FIG. 48 and FIG. 54, the sealant 22 is formed on the supporting ring 20, such that the stainless steel ring 24 surrounds the sealant 22. Finally, as shown in FIG. 49 and FIG. 55, the optical filter 26, which is formed on the sealant 22, shields the optical collimator 18 and the image sensor 12. Besides, the stainless steel ring 24 surrounds the optical filter 26.

In conclusion, the present invention forms the recess on the flexible printed circuit board, forms the image sensor in the recess, and alternatively uses the thermal release film to remove the substrate, thereby reducing the total thickness of the recognition device.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating an optical image recognition device comprising:

providing a substrate provided with a thermal release film thereon;

forming a flexible printed circuit board on the thermal release film, and a top of the flexible printed circuit board is provided with a recess;

forming an image sensor in the recess, an annular gap formed between sidewalls of the image sensor and the recess, forming an optical collimator on the image sensor, and forming a sealing glue in the annular gap to adhere to the flexible printed circuit board and the image sensor;

forming a plurality of conductive wires on the image sensor and the flexible printed circuit board to electrically connect to the image sensor and the flexible printed circuit board;

forming an insulation glue on the image sensor, the flexible printed circuit board, and the sealing glue to encapsulate the plurality of conductive wires;

forming a supporting ring on the flexible printed circuit board to surround the insulation glue and the optical collimator, and a height of a top of the supporting ring is higher than heights of tops of the plurality of conductive wires and a height of a top of the optical collimator;

forming a sealant on the supporting ring;

forming an optical filter on the sealant to shield the optical collimator and the image sensor; and removing the substrate and the thermal release film from the flexible printed circuit board.

2. The method for fabricating an optical image recognition device according to claim 1, wherein after the step of forming the optical filter on the sealant and before the step of removing the substrate and the thermal release film from the flexible printed circuit board, a packaging glue is formed on the flexible printed circuit board, the supporting ring, and the optical filter to cover sidewalls of the supporting ring and the thermal release film.

3. The method for fabricating an optical image recognition device according to claim 1, wherein in the step of forming the image sensor in the recess, forming the optical collimator on the image sensor, and forming the sealing glue in the annular gap, the sealing glue is formed in the annular gap after forming the image sensor in the recess and forming the optical collimator on the image sensor.

4. The method for fabricating an optical image recognition device according to claim 1, wherein the recess penetrates through the flexible printed circuit board and a height of a bottom of the image sensor is equal to a height of a bottom of the flexible printed circuit board.

5. The method for fabricating an optical image recognition device according to claim 1, wherein in the step of forming the sealant on the supporting ring, the sealant and a stainless steel ring are formed on the supporting ring, and a height of a top of the stainless steel ring is equal to a height of a top of the sealant; and in the step of forming the optical filter on the sealant, the optical filter is formed on the sealant and the stainless steel ring.

* * * * *